United States Patent
Park

(10) Patent No.: US 7,053,728 B2
(45) Date of Patent: May 30, 2006

(54) IMPEDANCE TRANSFORMATION NETWORK, POWER AMPLIFIER AND METHOD FOR EFFICIENTLY TRANSMITTING OUTPUT SIGNAL USING A SERIES VARACTOR DEVICE

(75) Inventor: Chul Hong Park, San Jose, CA (US)

(73) Assignee: Avago Technologies General IP Pte. Ltd. (SG)

( * ) Notice: Subject to any disclaimer, the term of this patent is extended or adjusted under 35 U.S.C. 154(b) by 32 days.

(21) Appl. No.: 10/804,356

(22) Filed: Mar. 19, 2004

(65) Prior Publication Data

US 2005/0206472 A1   Sep. 22, 2005

(51) Int. Cl.
*H03H 7/38*   (2006.01)
(52) U.S. Cl. .................. 333/32; 333/33; 333/263; 333/17.3
(58) Field of Classification Search ............... 333/17.3, 333/32, 33, 263
See application file for complete search history.

(56) References Cited

U.S. PATENT DOCUMENTS

| | | | | |
|---|---|---|---|---|
| 3,569,795 A | * | 3/1971 | Gikow | 361/434 |
| 3,764,932 A | * | 10/1973 | Robinson | 330/297 |
| 4,499,524 A | * | 2/1985 | Shioleno | 361/772 |
| 5,424,691 A | * | 6/1995 | Sadinsky | 333/17.3 |
| 5,640,042 A | * | 6/1997 | Koscica et al. | 257/595 |
| 6,130,589 A | * | 10/2000 | Yamaguchi et al. | 333/32 |
| 6,563,153 B1 | * | 5/2003 | Wikborg et al. | 257/295 |
| 6,628,502 B1 | * | 9/2003 | Masumiya et al. | 361/321.2 |
| 2001/0054748 A1 | | 12/2001 | Wikborg et al. | |

* cited by examiner

*Primary Examiner*—Robert Pascal
*Assistant Examiner*—Kimberly Glenn

(57) ABSTRACT

An impedance transformation network, power amplifier and method for efficiently transmitting an output signal utilizes a series varactor device to provide a variable impedance transformation. The series varactor device may include a number of stacked ferroelectric varactors that function as a variable capacitor to provide the variable impedance transformation in response to the power level of the output signal.

10 Claims, 4 Drawing Sheets

US 7,053,728 B2

IMPEDANCE TRANSFORMATION NETWORK, POWER AMPLIFIER AND METHOD FOR EFFICIENTLY TRANSMITTING OUTPUT SIGNAL USING A SERIES VARACTOR DEVICE

BACKGROUND OF THE INVENTION

Although cellular phones are used primarily for making and receiving telephone calls, additional functionalities are being included in the cellular phones to allow users, for example, to take digital pictures, to listen to songs, to watch videos and/or to play games. These functionalities place a heavy demand on the cellular phone battery, which reduces the charged life of the battery. In a cellular phone, one of the most power-draining components is the power amplifier that transmits signals to the nearest cellular station. Therefore, the power-added efficiency (PAE) of a power amplifier, which is a measure of how much power is needed to achieve a given amount of amplification, is an important factor for the battery life of a cellular phone. With a higher PAE of the power amplifier, the amount of time that a user can talk on the cellular phone and/or operate other functionalities of the cellular phone can be increased.

In a power amplifier of a cellular phone, an impedance transformation network is used to reduce the impedance of the load (often 50 Ohms) to a more optimal output impedance for the amplifier so that the signal from the amplifier can properly be generated for the load. Although there are various impedance transformation networks, a conventional impedance transformation network of interest is an impedance transformation network that utilizes a set of stacked shunt ferroelectric varactors as a variable capacitor. Such an impedance transformation network is used in a power amplifier for cellular technologies that use variable transmission signal strength, such as Code Division Multiple Access (CDMA) technology, to achieve greater PAE for power levels other than the maximum power level. In contrast to semiconductor varactors, ferroelectric varactors have a higher Q factor, which makes these devices attractive for power amplifier applications.

However, the stacked shunt ferroelectric varactors of the conventional impedance transformation network are quite non-linear, and thus, the impedance transformation network requires a significant number of stacked shunt ferroelectric varactors to achieve an acceptable linearity. Unfortunately, as the number of stacked shunt ferroelectric varactors is increased, the series resistance is also increased, which degrades the total PAE of the power amplifier. Furthermore, the stacked shunt ferroelectric varactors must provide high capacitance for high power output levels, which means that the varactors must be operated at near zero DC voltage where the varactors are more non-linear. This necessitates additional stacked shunt ferroelectric varactors to achieve the desired linearity, resulting in greater series resistance.

In view of these concerns, what is needed is an impedance transformation network, power amplifier and method for efficiently transmitting an output signal in a power efficient manner.

SUMMARY OF THE INVENTION

An impedance transformation network, power amplifier and method for efficiently transmitting an output signal utilizes a series varactor device to provide a variable impedance transformation. The series varactor device may include a number of stacked ferroelectric varactors that function as a variable capacitor to provide the variable impedance transformation in response to the power level of the output signal. The use of the series varactor device increases the power-added efficiency of the power amplifier.

An impedance transformation network in accordance with an embodiment of the invention includes an input node to receive an output signal and an output node to transmit the output signal. The impedance transformation network further includes a fixed impedance transformation circuit and a varactor device. The fixed impedance transformation circuit is connected between the input node and the output node. The fixed impedance transformation circuit is configured to provide a fixed impedance transformation to partially transform a first impedance at the output node to a second impedance at the input node. The varactor device is connected in series between the input node and the output node. The varactor device is configured to provide a variable impedance transformation in response to a power level of the output signal to partially transform the first impedance at the output node to the second impedance at the input node.

A power amplifier in accordance with an embodiment of the invention includes an amplifier and an impedance transformation network. The amplifier is configured to provide an output signal, e.g., a radio frequency (RF) output signal. The impedance transformation network includes an input node connected to the amplifier and an output node to be connected to a load. The impedance transformation network further includes a varactor device connected in series between the input node and the output node. The varactor device is configured to provide a variable impedance transformation in response to a power level of the output signal to transform a load impedance at the output node to a desired impedance in a forward direction at the input node. The forward direction is the direction from the input node to the output node.

A method of transmitting an output signal to an output node in accordance with an embodiment of the invention includes receiving the output signal at an input node, and providing a variable impedance transformation between the input node and the output node using a varactor device connected in series between the input node and the output node. The variable impedance transformation is provided in response to a power level of the output signal to transform a first impedance at the output node to a second impedance at the input node.

Other aspects and advantages of the present invention will become apparent from the following detailed description, taken in conjunction with the accompanying drawings, illustrated by way of example of the principles of the invention.

DETAILED DESCRIPTION

Figure 1:
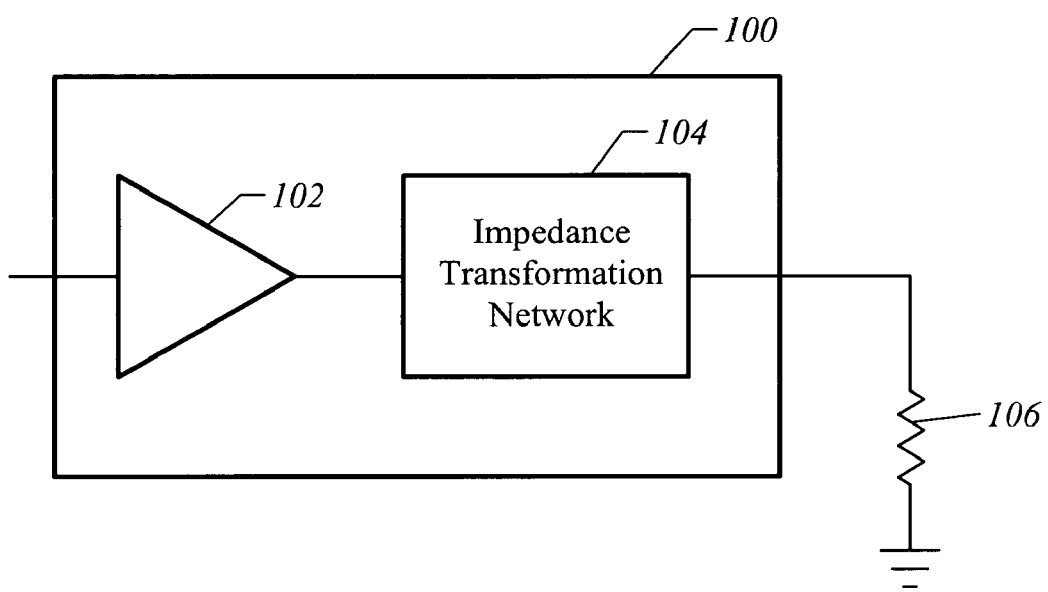
FIG. 1 is a block diagram of a radio frequency (RF) power amplifier including an impedance transformation network in accordance with an embodiment of the invention.

With reference to FIG. 1, a radio frequency (RF) power amplifier 100 in accordance with an embodiment of the invention is described. The RF power amplifier 100 may be used in a transmitter of a cellular phone to provide amplification of RF output signals being transmitted to the nearest cellular station. The RF power amplifier 100 transmits the output signals in variable strengths for use in cellular technologies that require such a technique, such as Code Division Multiple Access (CDMA) technology. Although the power amplifier 100 operates in the RF range in this embodiment, the power amplifier may operate in other frequency ranges in other embodiments.

As shown in FIG. 1, the RF power amplifier 100 includes an amplifier 102 and an impedance transformation network 104. The amplifier 102 receives and amplifies the RF output signals that are to be transmitted to a load, which is represented in FIG. I by a load resistor 106. The power level of the RF output signals is varied by an external device (not shown) to correlate the strength of the transmitted RF output signals with the current distance between the cellular phone embodying the RF power amplifier 100 and the nearest cellular station. As an example, the range of power for the RF output signals may be between 1 milliwatt to 1 watt.

The RF output signals from the amplifier 102 are transmitted to the load 106 through the impedance transformation network 104. The impedance transformation network 104 operates to transform the impedance of the load to a more optimal impedance for the amplifier 102. As an example, the load 106 may have an impedance of 50 Ohms. However, the amplifier 102 wants to "see" a significantly lower impedance than the load impedance, e.g., around 5 Ohms. Thus, the load impedance must be "transformed" to a more desired impedance so that the amplifier 102 can efficiently and optimally transmit the RF output signals to the load 106.

Figure 2:
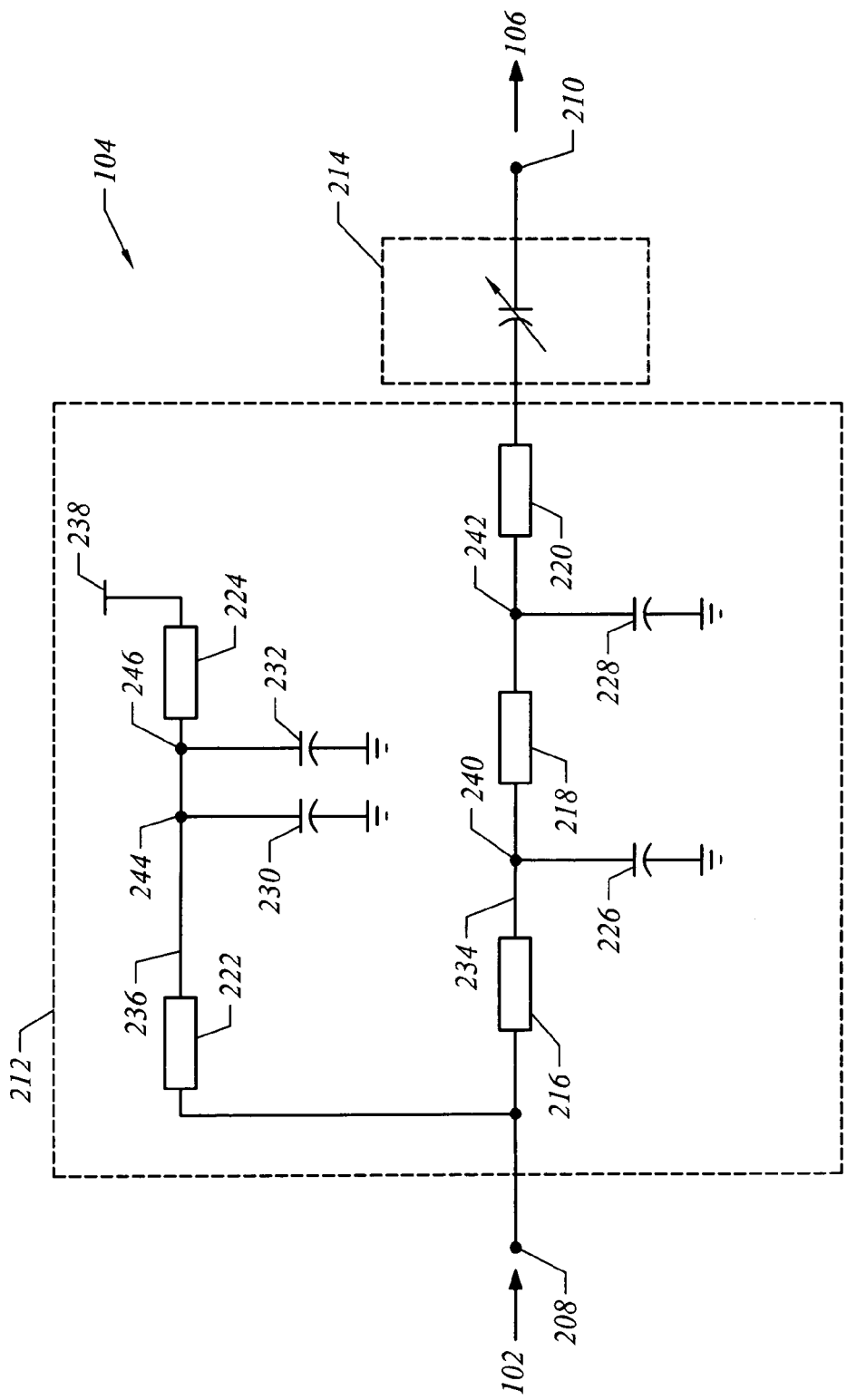
FIG. 2 is a diagram of the impedance transformation network of the RF power amplifier of FIG. 1 in accordance with an embodiment of the invention.

Turning now to FIG. 2, the impedance transformation network 104 in accordance with an embodiment of the invention is shown. The impedance transformation network 104 includes an input node 208, which is connected to the output of the amplifier 102, and an output node 210, which is connected to the load 106. The impedance transformation network 104 further includes a fixed impedance transformation circuit 212 and a variable impedance transformation device 214. The fixed impedance transformation circuit 212 provides a fixed impedance transformation regardless of the power level of the RF output signal from the amplifier 102 of the RF power amplifier 100. That is, the impedance transformation provided by the fixed impedance transformation circuit 212 is constant over the power level range of the RF output signals from the amplifier 102. In contrast, the variable impedance transformation device 214 provides a variable impedance transformation that is dependent on the power level of the RF output signal from the amplifier 102. That is, the impedance transformation provided by the variable impedance transformation device 214 changes in response to the power level of the RF output signal from the amplifier 102.

As shown in FIG. 2, the fixed impedance transformation circuit 212 includes transmission lines 216, 218, 220, 222 and 224 and shunt capacitors 226, 228, 230 and 232. The transmission lines 216, 218 and 220 are located on a signal path 234 between the input node 208 and the output node 210 of the impedance transformation network 104. The transmission lines 222 and 224 are located on a signal path 236 between the input node 208 and a high voltage terminal 238. The shunt capacitor 226 is connected between a node 240 on the signal path 234, which is located between the transmission lines 216 and 218, and ground. Similarly, the shunt capacitor 228 is connected between a node 242, which is located between the transmission lines 218 and 220, and ground. The shunt capacitor 230 is connected between a node 244 on the signal path 236, which is located between the transmission lines 222 and 224, and ground. Similarly, the shunt capacitor 232 is connected between a node 246, which is also located between the transmission lines 218 and 220, and ground.

The transmission lines 216–224 provide connections between the output of the amplifier 102 and the load 106 and between the high voltage terminal 238 and the signal path 234. In this embodiment, the transmission lines 216–224 are metal traces formed over a dielectric layer of a silicon substrate (not shown). The shunt capacitors 230 and 232 are realistic capacitors with parasitic resistance and parasitic inductance. As an example, the shunt capacitors 230 and 232 are surface mount technology (SMT) capacitors. The shunt capacitors 226 and 228 are chip capacitors with parasitic inductance, but with almost negligible parasitic resistance. As an example, the shunt capacitors 226 and 228 are metal-insulator-metal (MIM) capacitors.

The transmission lines 222 and 224 on the signal path 236 and the shunt capacitors 230 and 232 contribute to the fixed impedance transformation provided by the fixed impedance transformation circuit 212. In addition, since the signal path 236 connects the signal path 234 to the high voltage rail 238, the DC bias voltage can be supplied to the signal path 234 via the signal path 236. The transmission lines 216, 218 and 220 and the shunt capacitors 226 and 228 also contribute to the fixed impedance transformation provided by the fixed impedance transformation circuit 212. In addition, the transmission lines 216, 218 and 220 and the shunt capacitors 226 and 228 provide harmonic tuning of the output signal from the amplifier 102.

The parameters of the transmission lines 216–224 and the capacitance, inductance and resistance values of the shunt capacitors 226–232 are chosen to set the fixed impedance transformation of the fixed impedance transformation circuit 212, which along with the variable impedance transformation of the variable impedance transformation device 214 provide the overall impedance transformation needed to transform the load impedance at the output node 210 to a more optimal impedance in the forward direction at the input node 208 for the amplifier 102. The forward direction is the direction from the input node 208 to the output node 210. As an example, the following table shows parameters that can be used for the transmission lines 216–224.

TABLE 1

| Transmission Line | Width | Length | Dielectric Thickness | Dielectric Constant |
|---|---|---|---|---|
| Transmission Line 216 | 11.7 mm | 68 mm | 11 mm | 3.8 |
| Transmission Line 218 | 11.7 mm | 183 mm | 11 mm | 3.8 |
| Transmission Line 220 | 11.7 mm | 147 mm | 11 mm | 3.8 |
| Transmission Line 222 | 23.7 mm | 176 mm | 11 mm | 3.8 |
| Transmission Line 224 | 23.7 mm | 270 mm | 11 mm | 3.8 |

As another example, the following table shows the capacitance, inductance and resistance values of the shunt capacitors 226–232.

TABLE 2

| Capacitor | Capacitance | Inductance | Resistance |
| --- | --- | --- | --- |
| Capacitor 226 | 2.4 pF | 0.5 nH | n/a |
| Capacitor 228 | 1 pF | 0.5 nH | n/a |
| Capacitor 230 | 4700 pF | 1.8 nH | 600 mOhms |
| Capacitor 232 | 2.2 µF | 1.5 nH | 1000 mOhms |

The variable impedance transformation device 214 of the impedance transformation network 104 is a variable capacitor in the form of a set of stacked varactors (hereinafter "varactor device") connected in series with the transmission lines 216, 218 and 220 on the signal path 234 and located between the transmission line 220 and the output node 210. The series varactor device 214 provides a variable capacitance on the signal path 234 that is dependent on the applied DC bias voltage supplied from the high voltage terminal 238 through the signal path 236. Although the series varactor device 214 could include any type of stacked varactors, the series varactor device 214 preferably includes stacked ferroelectric varactors, which have a high Q factor in comparison with semiconductor varactors.

Figure 3:
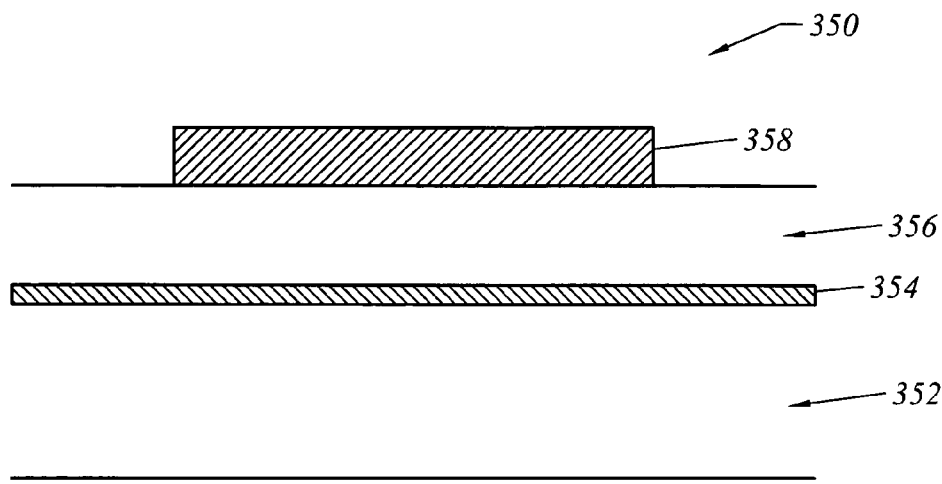
FIG. 3 is a cross-sectional view of a ferroelectric varactor of the impedance transformation network of FIG. 2 in accordance with an embodiment of the invention.

Turning now to FIG. 3, a cross-section of a ferroelectric varactor 350 included in the series varactor device 214 in accordance with an embodiment of the invention is shown. The ferroelectric varactor 350 is formed on a Silicon substrate 352. The ferroelectric varactor 350 includes a first electrode plate 354, a ferroelectric layer 356 and a second electrode plate 358. The first electrode plate 354 is located over the substrate 352. As an example, the first electrode plate is a layer of Platinum having a thickness of 100 Angstroms. The ferroelectric layer 356 is located over the first electrode plate 354. The ferroelectric layer 356 is made of a ferroelectric material, such as Strontium Titanate or Barium Strontium Titanate. As an example, the ferroelectric layer 356 has a thickness of 300 Angstroms. The second electrode plate 358 is located over the ferroelectric layer 356 such that the ferroelectric layer is sandwiched between the first and second electrode plates. As an example, the second electrode plate 358 is made of Gold having a thickness of 50 Angstroms.

Figure 4:
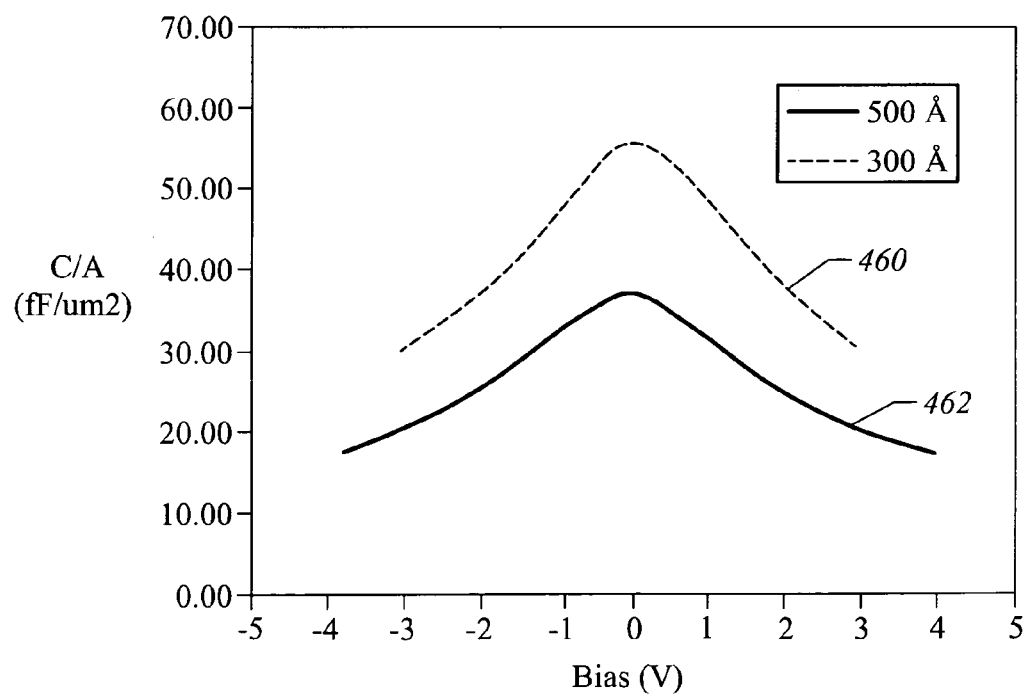
FIG. 4 shows two plotted curves, illustrating capacitance versus bias DC voltage for ferroelectric varactors with a ferroelectric layer thickness of 300 and 500 Angstroms, respectively.

The capacitance of the ferroelectric varactor 350 is dependent on the electric field created between the first and second electrode plates 354 and 358, where the ferroelectric layer 356 is located. Consequently, the capacitance of the ferroelectric varactor 350 changes with a change in the potential difference between the two electrode plates 354 and 358. In FIG. 4, two plotted curves 460 and 462 are shown, illustrating capacitance versus DC bias voltage for ferroelectric varactors with ferroelectric layer thicknesses of 300 and 500 Angstroms, respectively. As shown in FIG. 4, the plotted curves 460 and 462 have steep positive and negative slopes near zero DC bias voltage. Thus, around zero DC bias voltage, the capacitance value of the ferroelectric varactor 350 can change as fast as the modulation of the output signal from the amplifier 102, which causes non-linearity problem. Although not illustrated, the slope of the plotted curves 460 and 462 becomes more flat at higher DC bias voltage, e.g., at 10 volts.

An advantage of the series ferroelectric varactor device 214 of the impedance transformation network 104 is described in comparison with a shunt ferroelectric varactor device (not shown), which is a device having stacked ferroelectric varactors in a shunt configuration. For a high output power level, low impedance must be provided by the variable impedance transformation device 214 to achieve the necessary impedance transformation. Using the shunt ferroelectric varactor device, low impedance is achieved by operating the device at a higher capacitance region, which is near zero DC bias voltage, as illustrated in FIG. 4. However, using the series ferroelectric varactor device 214, low impedance is achieved by operating the device at a lower capacitance region, e.g., at DC bias voltage of 10 volts. Due to the non-linearity problem near zero DC bias voltage, the shunt ferroelectric varactor device requires more stacked ferroelectric varactors than the series ferroelectric varactor device 214 to reduce the non-linearity problem. However, an increase in the number of stacked ferroelectric varactors corresponds to an increase in the series resistance of the stacked ferroelectric varactors, which degrades the maximum output power and the power-added efficiency of the RF power amplifier 100. Thus, the series ferroelectric varactor device 214 has better performance when compared to the shunt ferroelectric varactor device.

Figure 5:
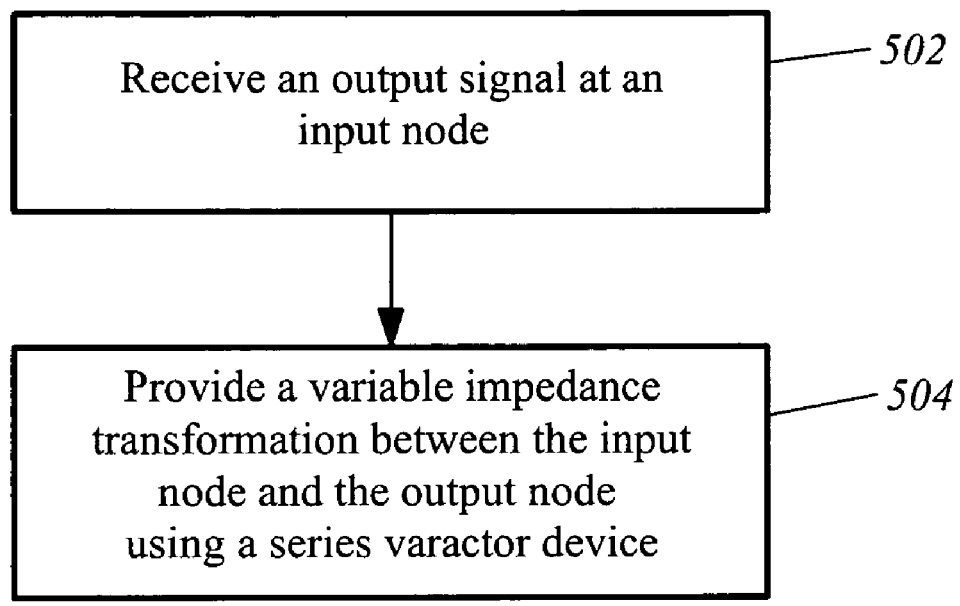
FIG. 5 is a flow diagram of a method for transmitting a RF output signal at an output node in accordance with an embodiment of the invention.

A method of transmitting an RF output signal to an output node is described with reference to a flow diagram of FIG. 5. At block 502, the RF output signal is received at an input node. As an example, the power level of the output signal may be between 1 watt and 1 milliwatt. Next, at block 504, a variable impedance transformation is provided using a varactor device connected in series on a signal path between the input node and the output node. The varactor device may include a number of stacked ferroelectric varactors. The variable impedance transformation is provided in response to the power level of the RF output signal to transform a first impedance at the output node, e.g., the load impedance, to a second impedance at the input node in a forward direction from the input node to the output node, e.g., to a more optimal impedance for an amplifier providing the RF output signal.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An impedance transformation network comprising:
   an input node to receive an output signal;
   an output node to transmit the output signal;
   a fixed impedance transformation circuit connected between the input node and the output node, the fixed impedance transformation circuit being configured to provide a fixed impedance transformation to partially transform a first impedance at the output node to a second impedance at the input node; and
   a varactor device connected in series on a signal path from the input node to the output node, the varactor device being configured to provide a variable impedance transformation in response to a power level of the output signal to partially transform the first. impedance at the output node to the second impedance at the input node,
   wherein the fixed impedance transformation circuit includes at least one transmission line on the signal path and at least one shunt capacitor connected to the signal path, the fixed impedance transformation circuit further including at least one additional transmission line on a second signal path between a supply voltage terminal and the signal path and at least one additional shunt capacitor connected to the second signal path, the second signal path at least partially being used to supply DC bias voltage to the varactor device.

2. The impedance transformation network of claim 1 wherein the varactor device includes a ferroelectric varactor connected in series on the signal path.

3. The impedance transformation network of claim 1 wherein the shunt capacitor is a chip capacitor.

4. The impedance transformation network of claim 1 wherein the additional shunt capacitor is a surface mount technology capacitor.

5. A method of transmitting an output signal to an output node, the method comprising:
   receiving the output signal at an input node;
   providing a fixed impedance transformation between the input node and the output node; and
   providing a variable impedance transformation between the input node and the output node using a varactor device connected in series on a signal path from the input node to the output node, the variable impedance transformation being provided in response to a power level of the output signal to transform a first impedance at the output node to a second impedance at the input node,
   wherein the fixed impedance transformation is provided by at least one transmission line on the signal path and at least one shunt capacitor connected to the signal path, the fixed impedance transformation being further provided by at least one additional transmission line on a second signal path between a supply voltage terminal and the signal path, the second signal path at least partially being used to supply DC bias voltage to the varactor device.

6. The method of claim 5 wherein the varactor device includes a ferroelectric varactor connected in series on the signal path.

7. The method of claim 5 wherein the receiving of the output signal included receiving a radio frequency output signal at the input node.

8. A power amplifier comprising:
   an amplifier configured to provide an output signal; and
   an impedance transformation network including an input node and an output node, the input node being connected to the amplifier, the output node to be connected to a load, the impedance transformation network further including a varactor device connected in series on a signal path from the input node to the output node, the varactor device being configured to provide a variable impedance transformation in response to a power level of the output signal to transform a load impedance at the output node to a desired impedance in a forward direction at the input node, the forward direction being from the input node to the output node,
   wherein the impedance transformation network comprises a fixed impedance transformation circuit connected to the input node and the varactor device, the fixed impedance transformation circuit including at least one transmission line on the signal path and at least one shunt capacitor connected to the signal path, the fixed impedance transformation circuit further including at least one additional transmission line on a second signal path between a supply voltage terminal and the signal path and at least one additional shunt capacitor connected to the second signal path, the second signal path at least partially being used to supply DC bias voltage to the varactor device.

9. The power amplifier of claim 8 wherein the varactor device includes a ferroelectric varactor connected in series on the signal path.

10. The power amplifier of claim 8 wherein the amplifier is configured to provide a radio frequency output signal.

* * * * *